United States Patent [19]
Ando

[11] Patent Number: 5,029,142
[45] Date of Patent: Jul. 2, 1991

[54] STATIC MEMORY DEVICE PROVIDED WITH A SIGNAL GENERATING CIRCUIT FOR HIGH-SPEED PRECHARGE

[75] Inventor: Manabu Ando, Tokyo, Japan

[73] Assignee: NEC Corporation, Tokyo, Japan

[21] Appl. No.: 400,309

[22] Filed: Aug. 29, 1989

[30] Foreign Application Priority Data

Aug. 29, 1988 [JP] Japan .................................. 63-214209

[51] Int. Cl.$^5$ .......................... G11C 7/00; G11C 8/00; G11C 11/407
[52] U.S. Cl. .................. 365/233.5; 365/203; 365/189.08; 365/230.03
[58] Field of Search ................. 365/203, 230.03, 233.5, 365/233, 189.08, 202

[56] References Cited

U.S. PATENT DOCUMENTS

| | | | |
|---|---|---|---|
| 4,751,680 | 6/1988 | Wang et al. | 365/233.5 |
| 4,787,068 | 11/1988 | Kihara | 365/233.5 |
| 4,843,596 | 6/1989 | Miyatake et al. | 365/233.5 |

Primary Examiner—Alyssa H. Bowler
Attorney, Agent, or Firm—Sughrue, Mion, Zinn, Macpeak & Seas

[57] ABSTRACT

An asynchronous type static memory device in which a plurality of pairs of bit lines are equalized upon change of address signals at a high speed is disclosed. The memory device comprises a plurality of memory blocks having a plurality of pairs of bit lines and a plurality of equalizing circuits provided for the plurality of pairs of bit lines, a plurality of address terminals receiving address signals, and an address transistion detecting circuit having a plurality of detection units, each of the detection units being coupled to one of the address terminals and generating a detecting signal when the signal at the associated address terminal coupled thereto is changed, a first logic section for generating a first number of intermediate logic signals for performing logical sum with respect to outputs of the detection units, the first number being smaller than the number of the detection units, and a plurality of second logic sections provided for the plurality of memory blocks respectively, each of the second logic sections operatively generating a control signal for enabling the equalizing circuits associated therewith as a result of performing a logical sum of the intermediate logic signals.

5 Claims, 6 Drawing Sheets

STATIC MEMORY DEVICE PROVIDED WITH A SIGNAL GENERATING CIRCUIT FOR HIGH-SPEED PRECHARGE

BACKGROUND OF THE INVENTION

1. Field of the Invention

The present invention relates to a semiconductor memory device formed on a semiconductor substrate, and more particularly to an asynchronous type static memory device having a precharge signal generating circuit for generating a precharge signal upon a change in address signals.

2. Description of the Related Art

Static memory devices comprise a memory array of memory cells for storing data in the form of binary logic levels. A memory cell to be selected for reading or writing is identified by row and column address applied to the memory. In particular, a memory cell is accessed by means of a word line and a pair of bit lines selected by a row address and a column address, respectively. In operation, each of the bit lines is set at a level according to data stored in the memory cell connected thereto and to a selected word line, and thus if a bit line has a low logic level after reading the data in a first memory cell, this bit line has to change to a high logic level on reading the opposite data from next memory cell. In this case, a significant time is required for the bit line to accomplish such a change in logic levels, thereby limiting the operation speed. In order to avoid the above problem, equalization of potentials at each pair of bit lines is performed prior to each access operation.

In an asynchronous type static memory which does not receive any clock or timing signal, such equalization of the bit lines is performed by detecting change in address signals by an address transition detecting (ATD) circuit. An example of this technique is disclosed in U.S. Pat. No. 4,355,377 issued to Rahul Sud et al. According to this technique, bit lines are equalized in potential before read data out of a memory cell, by a potential-equalizing signal generated in accordance with an output of the ATD circuit which detects the change of an address and generates a one-shot precharge signal, and thereby a reading speed is increased.

Since the memory receives a plurality of address signals and change in any one of the address signals causes the change in the address to be accessed, the ATD circuit is adopted to generate the one-shot precharge signal when any one of the address signals is changed in levels. Therefore, the ATD circuit is constructed by a plurality of detection units and a logical sum (OR) circuit receiving output from all the detection units. Each of the detection units is supplied with each one of address signals, and generates an active level of output signal upon change in levels of the supplied address signal.

The logical sum circuit generates the one-shot precharge signal when at least one of the detection units generates the active level of output signal. The output of the logical sum circuit, i.e. the one-shot precharge signal is applied to all the equalizing or precharge driver circuits provided to the plurality of bit line pairs, and the number of the bit lines of the recent memory having a large memory capacity such as 1 mega bits or more, is very large. Therefore, in the conventional static memory, a length of a control wiring for carrying the one-shot precharge signal to the precharge driver circuit from the ATD circuit, particularly the logical sum circuit is very long. Accordingly, the above control wiring inevitably has a large stray capacitance and a large load capacitance. As a result, it is difficult to apply a sufficient level of the one-shot precharge signal to the precharge drive circuit from the ATD circuit at a high speed through the control wiring, in the conventional memory. Thus, it is difficult to achieve a high speed precharge operation in the conventional memory.

SUMMARY OF THE INVENTION

It is an object of the present invention to provide a static memory device provided with an improved bit line precharging arrangement operable at a high speed.

It is another object of the present invention to provide an asynchronous type static memory provided with an improved address transition detecting circuit suitable for a large memory capacity.

A static memory device according to the present invention comprises a plurality of memory blocks, each of the memory blocks including a plurality of pairs of bit lines, a plurality of equalizing circuits provided for equalizing the pairs of bit lines and, a plurality of static memory cells coupled to the bit lines; a plurality of address terminals for receiving address signals; a plurality of address transition detecting units, each of the detecting units being coupled to one of the address terminals for operatively generating a detection signal at its output terminal when the address signal received by the associated address terminal is changed; a first logic section for operatively generating a first number of intermediate logic signals representing a logical sum of logic levels at the output terminals of the plurality of detection units, the first number being smaller than the number of the detection units; a plurality of second logic sections provided for the memory blocks, each of the second logic sections generating a control signal representing a logical sum of the intermediate logic signals, and a plurality of control means provided for the memory blocks, each of the control means enabling the equalizing circuits of the associated memory block when the control signal generated by the associated second logic section is at an active level.

According to the present invention, a plurality of pairs of bit lines and a plurality of equalizing circuits for equalizing pairs of bit lines are divided into a plurality of memory blocks, and each of the memory blocks is provided with the independent second logic section generating the control signal as a result of the logical sum of the intermediate logic signal. Thus, each of the second logic sections drive a small number of the equalizing circuits which number is reduced by the factor of the number of memory blocks. Accordingly, the equalizing circuits can be driven at a high speed.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Prior Art

Figure 1:
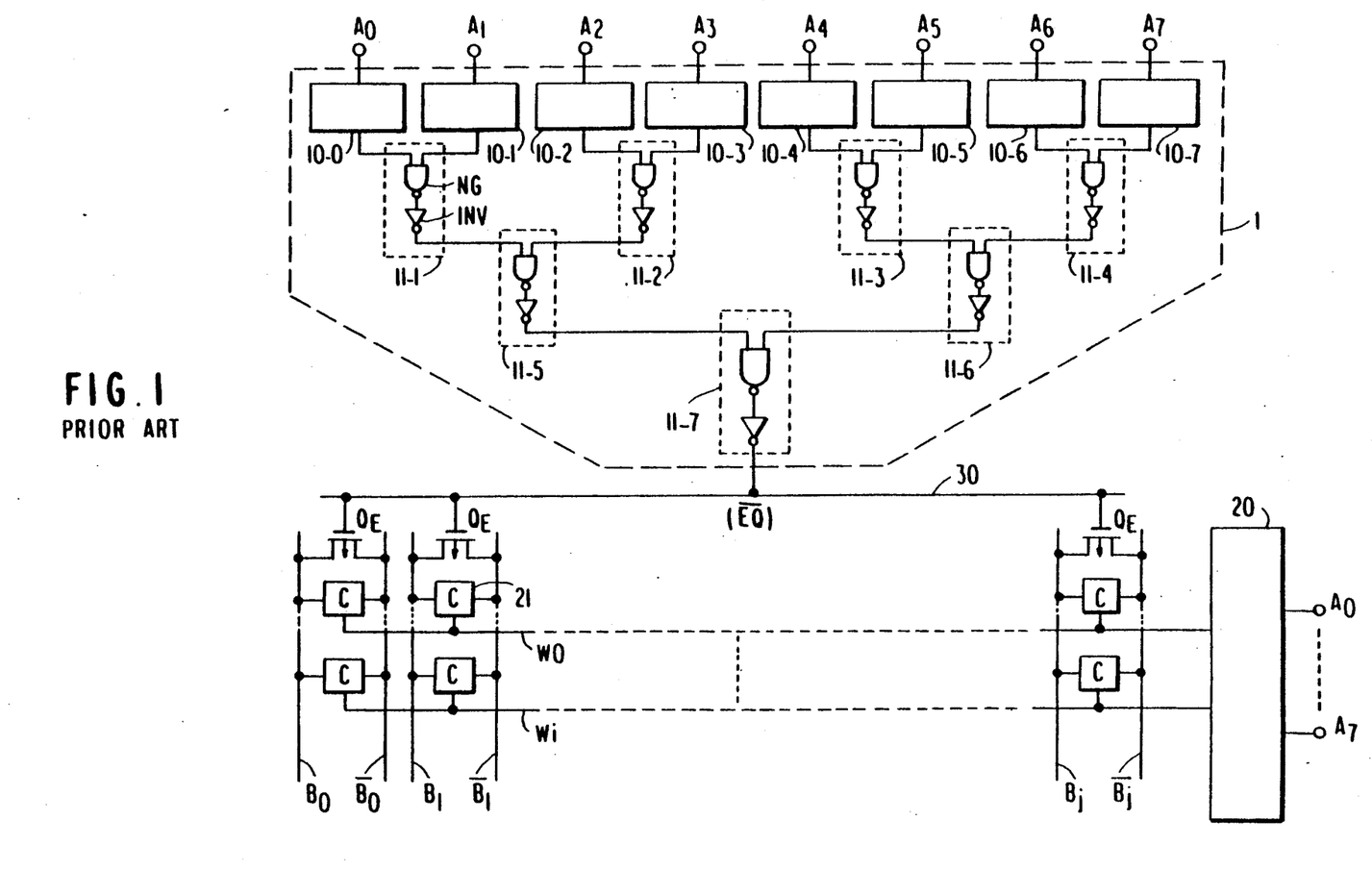
FIG. 1 is a schematic block diagram showing a first example of the conventional static memory.

With reference to FIG. 1, an example of the static memory device in the prior art will be explained briefly.

A plurality of static type memory cells (c) 21 are arranged in a matrix form of rows and columns, and a plurality of word lines $W_0$–$W_i$ and a plurality of bit line pairs $\overline{B_0}$–$B_j$, $\overline{B_j}$ are arranged in rows and columns, respectively in a known way. The word lines are coupled to a row decoder 20 receiving row address signals $A_0$–$A_7$. A plurality of P-channel MOS transistors $Q_E$ are provided for the bit line pairs for equalizing a pair of bit lines in the respective bit line pairs by short-circuiting them in response to an equalize control signal $\overline{EQ}$ supplied from an address detection (ATD) circuit 1 through a control wiring 30.

The ATD circuit 1 includes a change detection units 10-0 to 10-7 coupled to receive the address signals $A_0$ to $A_7$ respectively, and a plurality of logical sum circuits 11-1 to 11-7. Each of the detector units generates a low level of output signal as a change detection signal when the address signal associated thereto is changed in levels. Each of the circuits 11-1 to 11-7 includes a NAND gate NG and an inverter INV. A resultant logical sum of all the outputs of the detection units 10-0 to 10-7 is generated through the circuits 11-1 to 11-6 from the output of the circuit 11-7. Thus, when at least one of the address signals $A_0$–$A_7$ is changed, a low level of the equalize control signal $\overline{EQ}$ from the circuit 11-7 so that each pair of bit lines are equalized to the same intermediate level.

Figure 2:
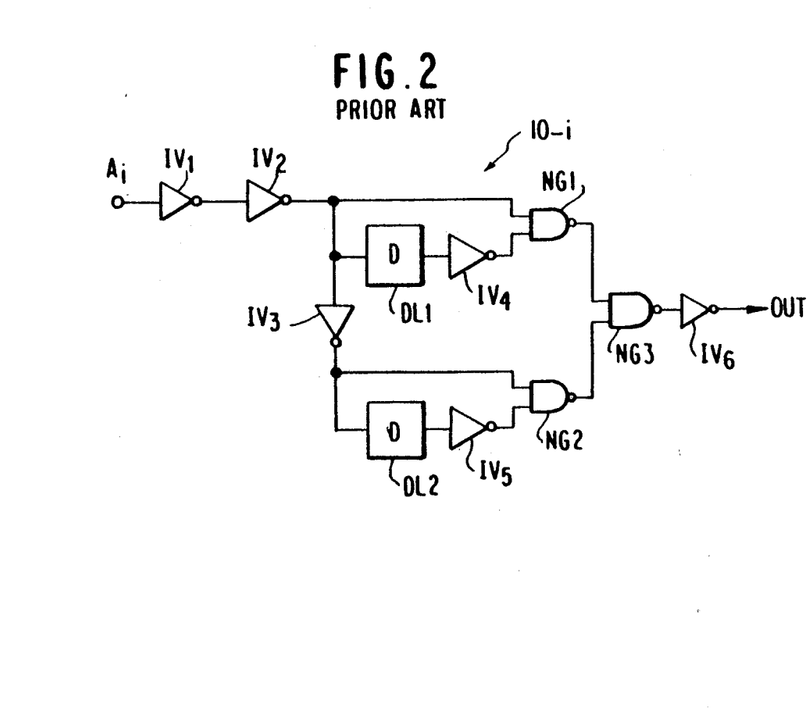
FIG. 2 is a schematic block diagram showing an address transition detection unit.

An example of the detection unit 10-i is shown in FIG. 2. The detection unit includes inverters $IV_1$–$IV_6$, delay circuits DL1, DL2 and NAND gates NG1, NG2, NG3, as illustrated in FIG. 2.

Figure 3:
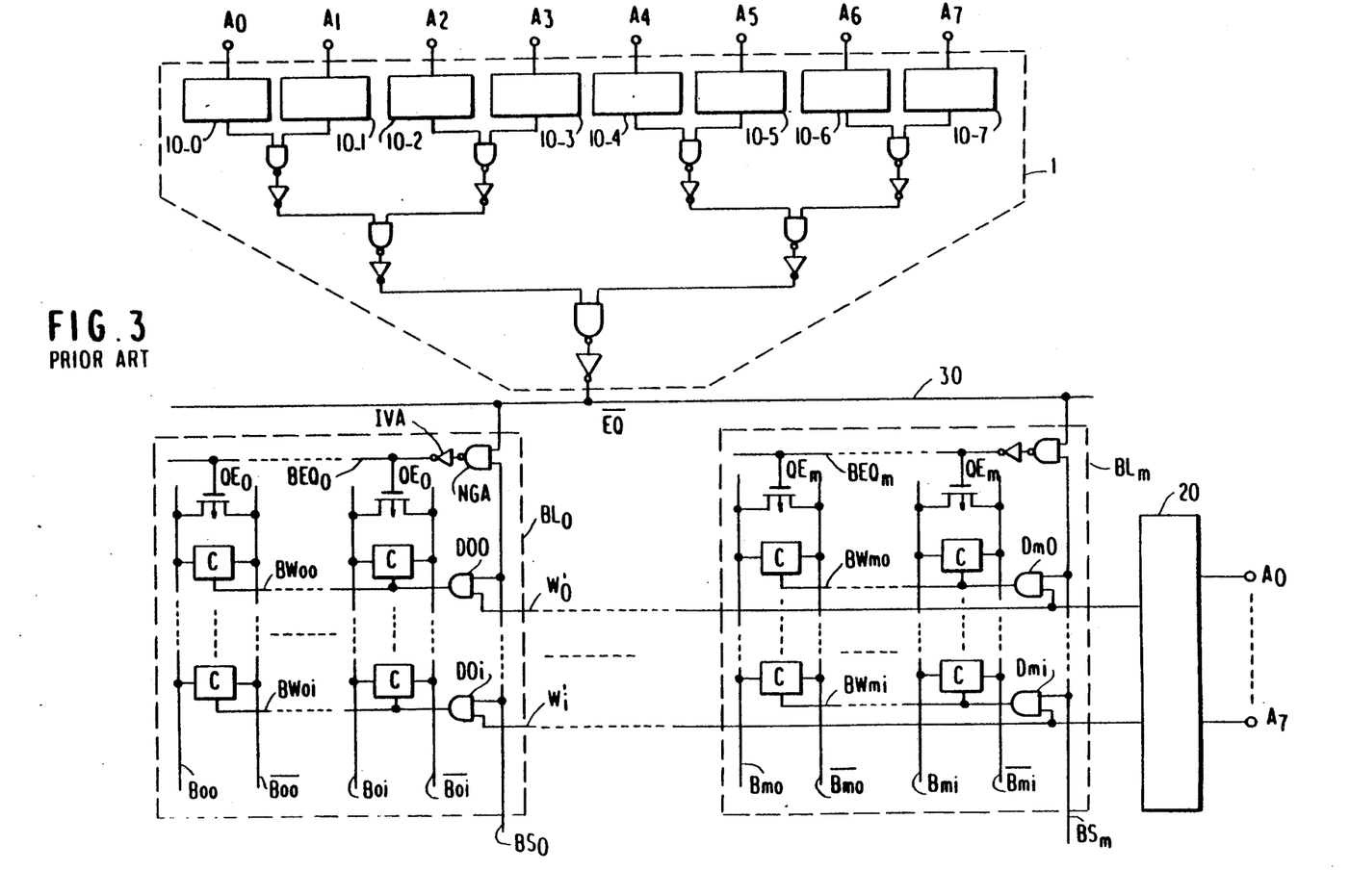
FIG. 3 is a schematic block diagram showing a second example of the conventional static memory.

Another example of the conventional memory is shown in FIG. 3.

This example is such as disclosed in IEEE Journal of Solid-State Circuits, Vol. SC-21, No. 5, October 1986, pp. 692 to 702. In this example, the array of memory cells is divided into a plurality of memory blocks $BL_0$–$BL_m$, and the equalizing transistors $QE_0$–$QE_m$ are separately controlled by $BEQ_0$–$BEQ_m$ according to the blocks thereof. In order to select one of the blocks, block selection signals $BS_0$–$BS_m$ are applied to the blocks $BL_0$–$BL_m$, respectively. When the block $BL_0$ is to be selected, the selection signal $BS_0$ is at a high level so that one of block word lines $BW_{oo}$–$BW_{oi}$ is selected in accordance with the selected main word line. Also, the low active signal $\overline{EQ}$ is grated through a NAND gate NGA and an inverter IVA as $BEQ_0$ upon change in the address signals so that the bit line pairs $B_{oo}$, $\overline{B_{oo}}$–$B_{ol}$, $\overline{B_{ol}}$ of the block $BL_0$ are equalized in a pulsed manner prior to a read operation. While, in other blocks such as $BL_m$, the selection signal $BS_m$ is at a low level and the signal $\overline{BEQ_m}$ is continuously at the low level irrespective of $\overline{EQ}$ so that the transistors $QE_m$ are continuously rendered conductive. Thus, the bit line pairs of the non-selected blocks are equalized in a static manner.

In the conventional memory of FIG. 1, the equalizing transistors $Q_E$ are driven directly by the signal $\overline{EQ}$ obtained by taking the logical sum of all the detection unit outputs, while in the circuit of FIG. 3, equalizing transistors $QE_0$–$QE_m$ are driven by signals $\overline{BEQ_0}$ to $\overline{BEQ_m}$ which are obtained by summing up logically the signal $\overline{EQ}$ obtained by the ATD circuit 1 and the selection signal $BS_0$ to $BS_m$ for selecting one memory block. The characteristic feature of this circuit is that, since only some of the equalizing transistors e.g. $QE_0$ are driven, the gate capacitance of the transistor $QE_0$ decreases proportional to the number of the blocks and therefore the consumption of power can be reduced in the operation of equalizing the potential.

The prior-art static memories described above have a construction wherein the signal obtained by taking the logical sum of all the detection units is distributed substantially to all bit lines. Therefore the lengths of the control wiring 30 is long, and the number of stages of the logic circuits required until a potential-equalizing signal is obtained is large, which results in a fault that the time of delay caused in a process from the transition of an address to the generation of the signal $\overline{EQ}$ is long. Moreover, the chip size of the static memory tends to be large, as the capacity thereof becomes large, and the above-mentioned output wiring length of the ATD circuit becomes longer and longer, which turns to be a large impediment now on the occasion when the signal $\overline{EQ}$ is generated at high speed.

Embodiments

Figure 4:
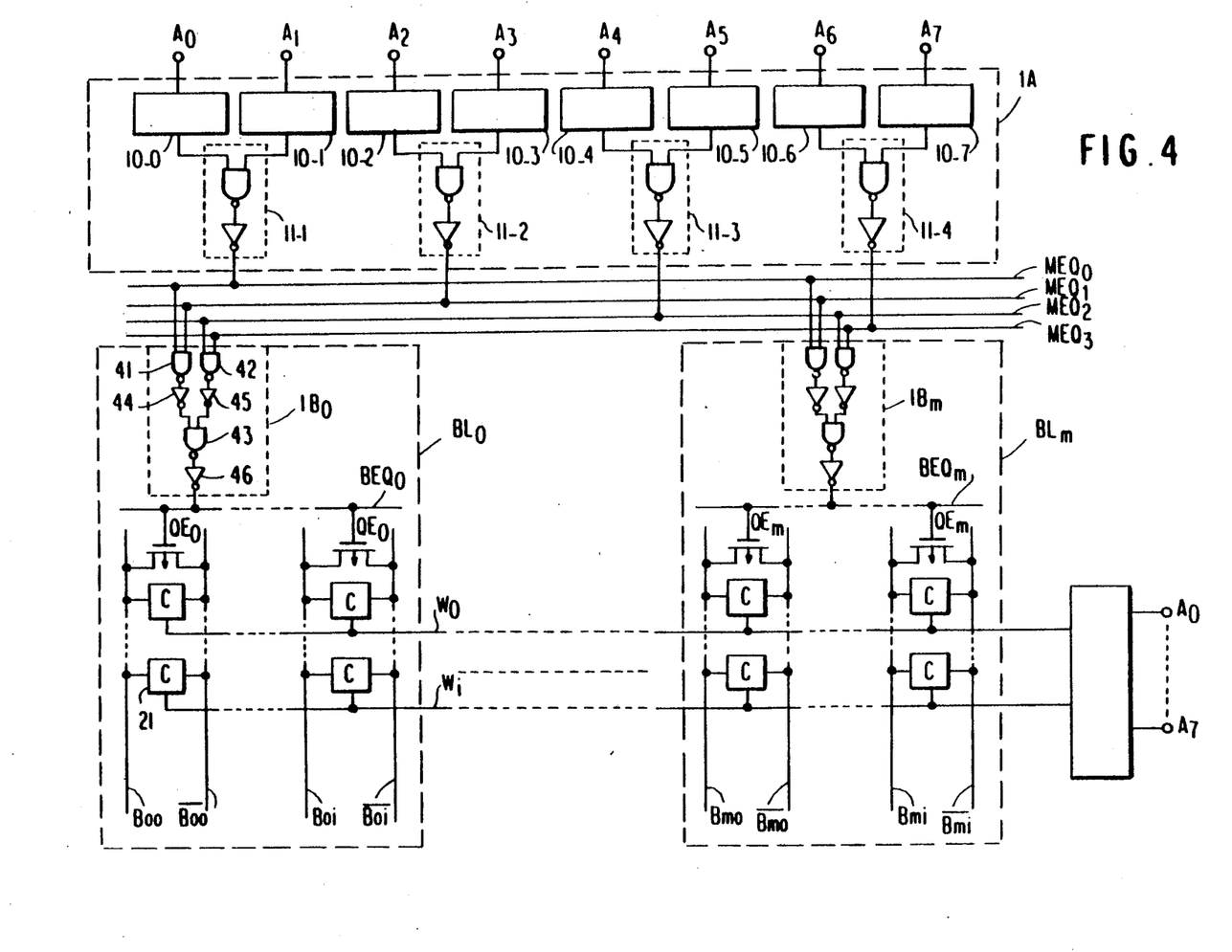
FIG. 4 is a schematic block diagram of a static memory device according to a first preferred embodiment of the present invention.

With reference to FIG. 4, the static memory device according to a first embodiment of the present invention will be explained.

In FIG. 4, the elements or portions corresponding to those in FIGS. 1 and 4 are denoted by the same or similar references and detailed description therefor will be omitted.

As shown in FIG. 4, the ATD circuit 1 of FIGS. 1 and 4 is split into a first stage section 1A and a plurality of second stage sections $1B_0$–$1B_m$ provided in accordance with the memory blocks $BL_0$–$BL_m$, respectively.

The first stage section 1A includes the change detection units 10-0 to 10-7 coupled to the row address inputs $A_0$ to $A_7$ and the logical sum circuits 11-1 to 11-4. Each of the second stage sections $1B_0$–$1B_m$ includes NAND gates 41, 42, 43 and inverters 44, 45, 46 and produces a logical sum with respect to the outputs of the first stage section 1A supplied through control wirings $MEQ_0$–$MEQ_3$. In other words, each of the second stage section serves as the logical sum circuits 11-5, 11-6 and 11-7 of FIG. 1. Thus, when at least one of the address signals $A_0$–$A_7$ is changed, all the second stage sections $1B_0$–$1B_m$ generate low (active) level of outputs to control lines $\overline{BEQ_0}$–$\overline{BEQ_m}$ and therefore the equalizing transistors $QE_0$–$QE_m$ of all the blocks $BL_0$–$BL_m$ are rendered conductive simultaneously to equalize the respective pairs of bit lines.

According to the present embodiment, each of the second stage sections drives a reduced number of the equalizing transistors by splitting the memory array into the plurality of memory blocks. Therefore, a load, i.e. the number of the transistors $QE_0$–$QE_m$ to be driven by each of the second stage sections is greatly reduced and the length of the respective control lines $BEQ_0$–$BEQ_m$ is also reduced. Therefore, the output of each second stage section is transmitted to the gates of the equalizing transistors at a high speed and equalizing operation of the bit lines is performed at a high speed.

Figure 5:
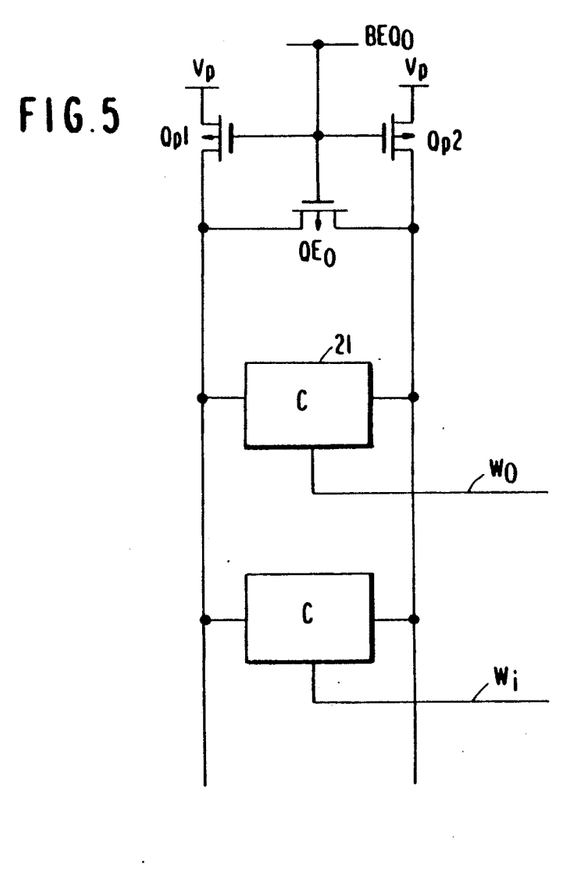
FIG. 5 is a schematic block diagram of the static memory device according to a second embodiment of the present invention.

FIG. 5 shows a modification of the embodiment of FIG. 4, as a second embodiment. According to this modification, a pair of precharge transistors of P-channel type $Q_{p1}$ and $Q_{p2}$ are inserted between each pair of bit lines and a precharge potential source $V_p$.

Figure 6:
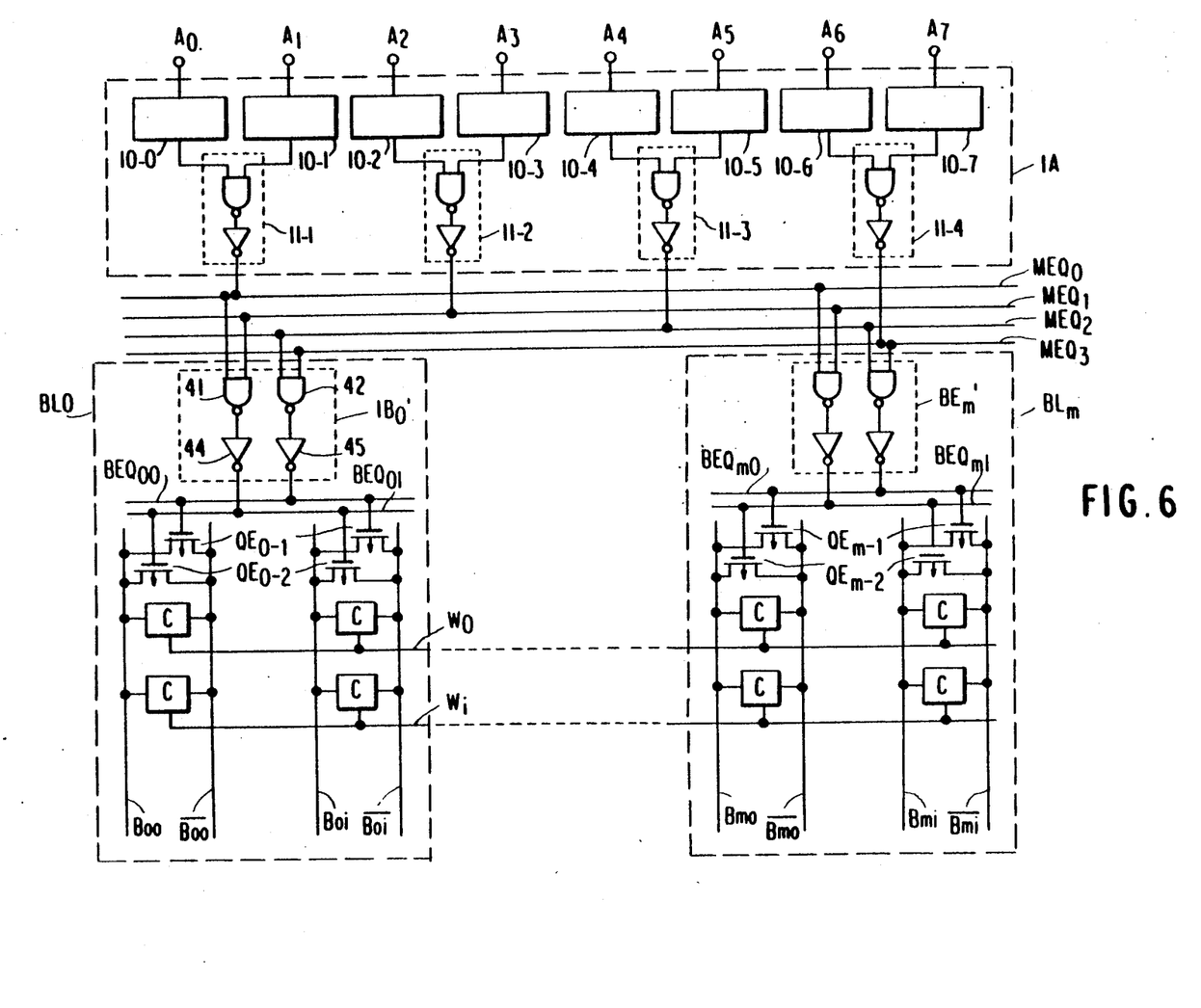
FIG. 6 is a schematic block diagram showing the static memory device according to a third embodiment of the present invention.

With reference to FIG. 6, the static memory device according to a third embodiment of the present invention will be explained.

According to this embodiment, a plurality of second stage sections $1B_0'$–$1B_m'$ are provided for the memory blocks $BL_0$–$BL_m$, respectively. The second stage section $1B_0'$ includes NAND gates 41, 42 and inverters 44, 45. Namely, the second section $1B_0'$ is obtained by removing the NAND gate 43 and the inverter 46 of the second section $1B_0$ of FIG. 4. While in place of the NAND gate 43 and the inverter 46 of FIG. 4, two equalizing transistors (P-channel type) $Q_{E0-1}$ and $Q_{E0-2}$ are connected between each pair of bit lines of the block $BL_0$ and the outputs of the inverters 45 and 44 are supplied to the gates of the transistors $Q_{E0-1}$ and $Q_{E0-2}$ through control lines $BEQ_{00}$ and $BEQ_{01}$, respectively.

Therefore, the pair of transistors $QE_{0-1}$ and $QE_{0-2}$ provided for each pair of bit lines perform a logical sum function with respect to the outputs ($BEQ_{00}$, $BEQ_{01}$) of the inverters 44 and 45.

Other second stage sections such as $BE_m'$ and other memory blocks such as $BL_m$ are constructed similarly. This embodiment is advantageous in that the number of circuit elements can be reduced by employing the pair of equalizing transistors in place of the logical sum circuit corresponding to the circuit 11-7 of FIG. 1.

Figure 7:
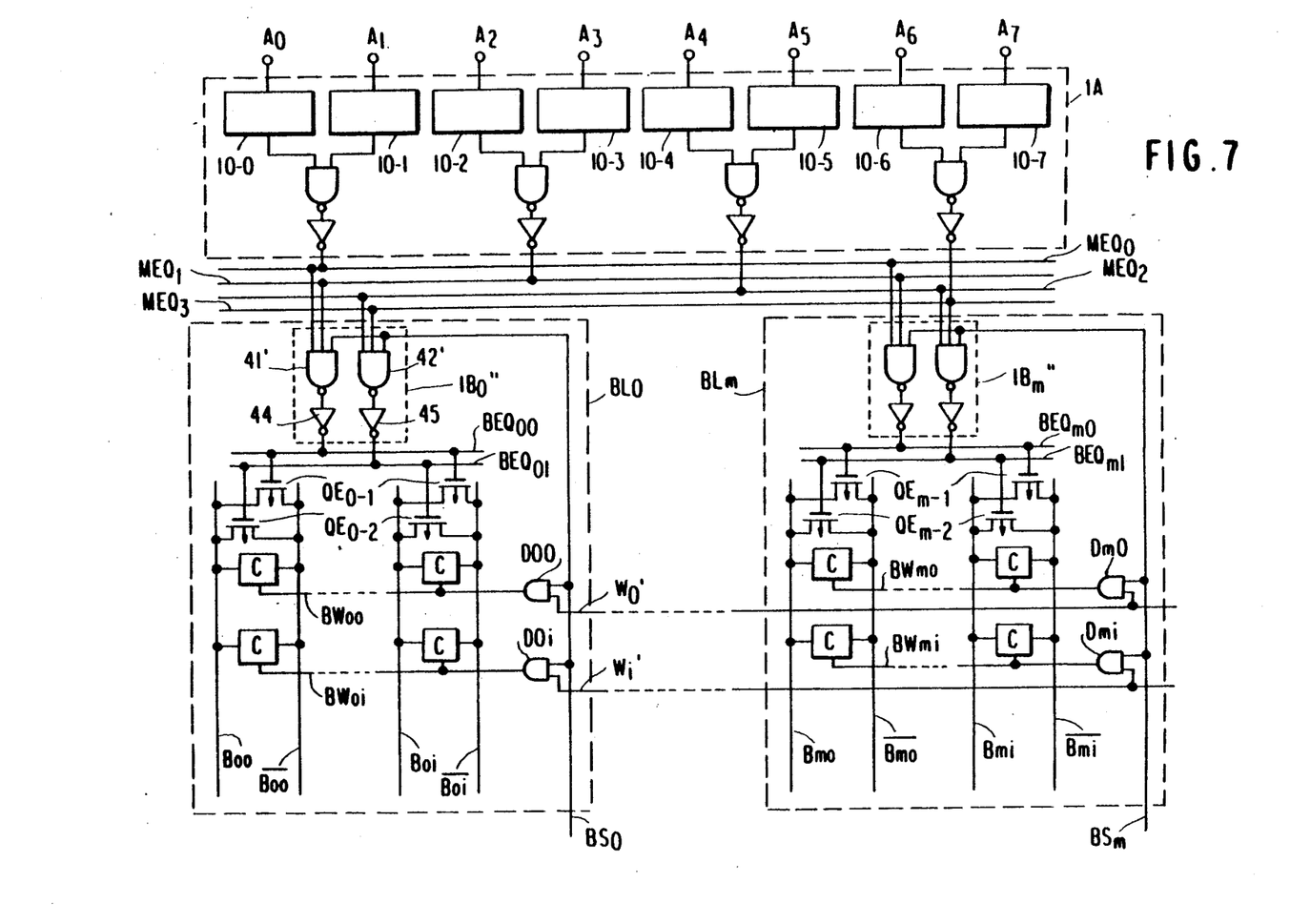
FIG. 7 is a schematic block diagram showing the memory device according to a fourth embodiment of the present invention.

With reference to FIG. 7, the memory device according to a fourth embodiment of the present invention will be explained.

This memory device is obtained by combining the memory structure of FIG. 3 and the embodiment of FIG. 6. Namely, the block selection signals $BS_0$–$BS_m$ for selecting the memory block to be accessed are also applied to the second stage sections $1B_0''$–$1B_m''$. For example, the block-selection signal $BS_0$ is inputted to NAND gates 41' and 42'' of the section $1B_0''$. If the block selection signal $BS_0$ is at the high level and the memory block $BL_0$ is selected, the second section $1B_0''$ operates in the same manner as the section $1B_0'$ of FIG. 6.

While in other memory blocks such as $BL_m$ and the second sections such as $1B_m''$, the selection signals such as $BS_m$ is at the low level. Therefore, the levels of the control lines $BEQ_{m0}$, $BEQ_{m1}$ are at the low levels and all the equalizing transistors $QE_{m-1}$, $QE_{m-2}$ are conductive throughout this state, irrespective of the outputs of the first stage section 1A. Thus, only the block $BL_0$ is subjected to the access operation through the equalizing operation. This construction enables the reduction of power consumption, as described on the prior-art example in FIG. 3.

Effect of the invention

By the construction described above wherein the ATDs are divided into two or more groups, the potential-equalizing signal being generated for each of the divided groups, while the memory cell arrays are divided into two or more memory cell array blocks, the circuit to take the logical sum of the two or more potential-equalizing signals and to generate the block potential-equalizing signal being provided for each of the divided memory cell array blocks, and the potential-equalizing transistor is driven by the block potential-equalizing signal, the present invention has excellent effects that the wiring length in the logical sum circuit can be shortened, and the number of logic stages can be reduced. Consequently, a time required from the transition of an address to the turn-ON of the potential-equalizing transistor can be shortened, thus making it possible to make high the speed of access to the static memory.

While the number of the ATD circuits is assumed to be eight and that of the main potential-equalizing signal lines to be four in the description of the present embodiments, these numbers can be varied, of course. In addition, the circuit to take the logical sum is constructed of NANDs and inverters therein, because the ATD circuit output is assumed to be a pulse having a peak projecting downward. Another circuit having an equivalent function may be employed, of course, in this relation within a scope not impairing the effects of the present invention.

As already stated, the chip size tends to increase as the demand for static memories to be of large capacity and high speed, and therefore the potential equalization of bit lines by using ATDs becomes a technique of increased importance. In such a tendency, the effects of the present invention are very great, since it enables the high-speed generation of the potential-equalizing signal.

What is claimed is:

1. A static memory device comprising:
   a plurality of memory blocks, each of said memory blocks including a plurality of pairs of bit lines, a plurality of equalizing circuits, each of said equalizing circuits, having a control terminal, and being for equalizing the associated pair of bit lines of the same memory block in response to an active level applied to said control terminal, and a plurality of static memory cells coupled to said bit lines;
   a plurality of address terminals for receiving address signals;
   a plurality of address transition detecting units, each of said address transition detecting units being coupled to one of said address terminals for operatively generating a detection signal at its output terminal when the address signal received by the associated address terminal is changed;
   a plurality of control signal lines extending along said plurality of memory blocks;
   a plurality of first logic-sum circuits having a plurality of input ends coupled to the output terminals of at least two of said address transition detecting units and an output end generating a first logic signal representing a logic sum of the input ends thereof, said output end of each one of said logic-sum circuits being coupled to each one of said control signal lines;
   a plurality of second logic-sum circuits each provided for each of said plurality of memory blocks, each of said second logic-sum circuits having a plurality of input ends coupled to said plurality of control signal lines and an output end generating a second logic signal representing a logic sum of levels at the input ends thereof; and a plurality of connection means for operatively coupling said address transition detection units with said equalizing circuits, each provided for each of said memory blocks, each of said connection means applying the active level to the control terminal of the associated equalizing circuit when at least one of said address transition detecting units generates said detection signal.

2. The static memory according to claim 1, in which a number of said control signal lines and a number of said first logic-sum circuits are a first number which is smaller than the number of said address terminals.

3. The static memory device according to claim 1, in which each of said equalizing circuits includes a field effect transistor having a source-drain path connected between each pair of bit lines.

4. The static memory device according to claim 1, further comprising a plurality of word lines extending through said plurality of memory blocks and coupled to said memory cells and a row selection circuit for selecting one of said word lines in response to said address signals.

5. The static memory device according to claim 1, further comprising means for selecting one of said memory blocks and means for enabling one of said second logic-sum circuits associated with the selected memory block.

* * * * *